United States Patent
Oh et al.

(10) Patent No.: US 7,671,622 B2
(45) Date of Patent: Mar. 2, 2010

(54) ON-DIE-TERMINATION CONTROL CIRCUIT AND METHOD

(75) Inventors: Seung-Min Oh, Kyoungki-do (KR); Ho-Youb Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/157,285

(22) Filed: Jun. 9, 2008

(65) Prior Publication Data
US 2009/0153185 A1 Jun. 18, 2009

(30) Foreign Application Priority Data
Dec. 12, 2007 (KR) .................. 10-2007-0128683

(51) Int. Cl.
*H03K 17/16* (2006.01)
*H03K 19/003* (2006.01)
(52) U.S. Cl. .................. 326/30; 326/32; 326/33
(58) Field of Classification Search .................. 326/30
See application file for complete search history.

(56) References Cited

U.S. PATENT DOCUMENTS

2007/0030030 A1* 2/2007 Waldrop .................. 326/93
2007/0126469 A1* 6/2007 Kim et al. .................. 326/30
2008/0159026 A1* 7/2008 Oh et al. .................. 365/194

FOREIGN PATENT DOCUMENTS

KR 10-2005-0081315 8/2005

* cited by examiner

*Primary Examiner*—Anh Q Tran
(74) *Attorney, Agent, or Firm*—Blakely, Sokoloff, Taylor & Zafman

(57) ABSTRACT

On-die-termination control circuit includes a mode detecting unit for detecting a power-down mode and a power-down delay configured to delay an on/off control signal in the power-down mode. On-die-termination control circuit provided a shift register configured to delay an on/off control signal in synchronization with shift clocks in a non-power-down mode, and transfer the on/off control signal as received without delay in a power-down mode, a power-down delay configured to delay the on/off control signal in the power-down mode, and not to delay the on/off control signal in the non-power-down mode and a controller configured to control enabling/disabling of an on-die-termination operation according to information about enable/disable timing of an on-die-termination operation provided by the on/off control signal that have passed through the shift register and the power-down delay.

17 Claims, 9 Drawing Sheets

ON-DIE-TERMINATION CONTROL CIRCUIT AND METHOD

CROSS-REFERENCE TO RELATED APPLICATIONS

The present invention claims priority of Korean patent application number 10-2007-0128683, filed on Dec. 12, 2007, which is incorporated by reference in its entirety.

BACKGROUND OF THE INVENTION

The present invention relates to an integrated circuit, and more particularly, to an integrated circuit configured to control enable/disable timing of an on-die-termination (ODT) operation for impedance control in a semiconductor device to prevent malfunctions of the semiconductor device.

Semiconductor devices are implemented into integrated circuit (IC) chips such as central processing units (CPUs), memories, and gate arrays, and are incorporated into a variety of electrical products such as personal computers, servers and workstations. Most semiconductor devices include a receiving circuit configured to receive external signals from an outside world through input pads and an output circuit configured to provide internal signals to an outside world through output pads.

As the operating speed of electrical products is increasing, a swing width of a signal exchanged between semiconductor devices is being gradually reduced for minimizing a delay time taken for signal transmission. However, the reduction in the swing width of the signal increases an influence of an external noise on the signal and causes the signal reflectance to become more critical at an interface terminal due to impedance mismatch. Such impedance mismatch is generally caused by an external noise, a variation of a power supply voltage, a change in an operating temperature, a change in a manufacturing process, etc. The impedance mismatch may lead to a difficulty in high-speed transmission of data and distortion in output data. Therefore, if semiconductor devices receive the distorted output signal through an input terminal, it frequently gives rise to problems such as a setup/hold failure and an error in decision of an input level.

In order to resolve the above problems, a memory device requiring high-speed performance employs an impedance matching circuit, which is called an ODT circuit, near an input pad inside an IC chip.

FIG. 1 is a block diagram of a typical ODT circuit and a typical ODT control circuit provided to a DDR2 semiconductor memory device.

The ODT control circuit includes an ODT buffer 110, a setup/hold delay 120, a shift register 130, and a controller 140 to control the ODT circuit 150.

The ODT buffer 110 buffers an on/off control signal ODT received from an external controller to enable/disable ODT operations.

The setup/hold delay 120 delays the buffered on/off control signal ODTI by a predetermined delay time to secure a setup/hold margin.

The shift register 130 delays the delayed on/off control signal ODT_SH received from the setup/hold delay 120 in synchronization with the shift clocks RCLKDLL0, FCLKDLL1, RCLKDLL2 and FCLKDLL3. Logic levels of the shift clocks RCLKDLL0, FCLKDLL1, RCLKDLL2 and FCLKDLL3 are fixed to a logic high level in a power-down mode, whereas they toggle in the non-power-down mode. Accordingly, the shift register 130 delays the delayed on/off control signal ODT_SH only in a non-power mode.

The shift register 130 also receives termination resistance information signals ODT0, ODT1 and ODT2 from an extended mode register set (EMRS) to determine termination resistance of the ODT circuit 150 according to which signals among the termination resistance information signals ODT0, ODT1 and ODT2 are activated. For example, the termination resistance of the ODT circuit 150 is 150Ω when the termination resistance information signal ODT0 is activated, 75Ω when the termination resistance information signals ODT0 and ODT1 are activated, and 50Ω when all the termination resistance information signals ODT0, ODT1 and ODT2 are activated. The shift register 130 delays the delayed on/off control signal ODT_SH in synchronization with the shift clocks RCLKDLL0, FCLKDLL1, RCLKDLL2 and FCLKDLL3, and outputs signals selected among signals ODTOUT0, ODTOUT1 and ODTOUT2 according to the activated signals among the termination resistance information signals ODT0, ODT1 and ODT2. Here, output timing of the signals ODTOUT0, ODTOUT1 and ODTOUT2 depends on the timing of the delayed on/off control signal ODT_SH. Which signal among the signals ODTOUT0, ODTOUT1 and ODTOUT2 is activated depends on which signal among the termination resistance information signals ODT0, ODT1 and ODT2 is input.

The controller 140 decodes the signals ODTOUT0, ODTOUT1 and ODTOUT2 received from the shift register 130 to activate at least one of signals SW0_UP, SW1_UP, SW2_UP, SW0_DN, SW1_DN and SW2_DN, thereby enabling/disabling resistors in the ODT circuit 150.

The circuit 160 shown at the left side of FIG. 1 receives the termination resistance information signals ODT0, ODT1 and ODT2. If at least one signal among the termination resistance information signals ODT0, ODT1 and ODT2 is activated, circuit 160 activates a signal ODTENB, thereby enabling the ODT buffer 110 and the shift register 130.

In summary, timing for enabling/disabling the ODT circuit 150 is determined by a delay time of the on/off control signal ODT. The delay time is determined by transferring the on/off control signals ODT from an external controller to the shift resistor 130 via the ODT buffer 110 and the setup/hold delay 120. In addition, the resistance of the ODT circuit 150 is determined by the termination resistance information signals ODT0, ODT1 and ODT2 activated by the EMRS. More detailed description of the operation of the ODT control circuit will be described later with reference to FIG. 4.

FIG. 2 is a circuit diagram of the ODT circuit 150 of FIG. 1.

Referring to FIG. 2, the ODT circuit 150 includes a plurality of resistors 151 to 156 for terminating an input/output node DQ in a pull-up direction or in a pull-down direction. The resistors 151 to 156 are turned on/off in response to signals SW0_UP, SW0_DN, SW1_UP, SW1_DN, SW2_UP and SW2_DN received from the controller 140.

For example, when the termination resistance is set to 150, the resistors 151 and 152 are turned on in response to the signals SW0_UP and SW0_DN to terminate the input/output node DQ with a resistance of 150. Similarly, when the termination resistance is set to 75, the resistors 151, 152, 153 and 154 are turned on, and when the termination resistance is set to 50, all the resistors 151, 152, 153, 154, 155 and 156 are turned on.

FIG. 3 is a circuit diagram of a shift register 130 shown in FIG. 1.

Referring to FIG. 3, the shift register 130 includes pass gates PG1, PG2, PG3, PG4 and PG5 which are turned on/off in response to an internal clock CK0 and shift clocks RCLKDLL0, FCLKDLL1, RCLKDLL2, FCLKDLL3.

Here, the shift clocks RCLKDLL0, FCLKDLL1, RCLKDLL2, FCLKDLL3 with different phases are generated by the output clocks FCLKDLL and RCLKDLL of the DLL.

In a non-power-down mode (i.e., when the clock enable signal CKE has a logic high level), if at least one of the termination resistance information signals ODT0, ODT1 and ODT2 are activated, the signal ODTENB is activated to a logic low level. Then, the shift register 130 becomes able to receive the delayed on/off control signal ODT_SH. While the internal clock CK0 is at a logic high level, the delayed on/off control signal ODT_SH is transferred to a node ND. Thereafter, the delayed on/off control signal ODT_SH is transferred further sequentially in response to the shift clocks RCLKDLL0, FCLKDLL1, RCLKDLL2, FCLKDLL3. Then, a NAND operation is performed on a signal ODTOND before the pass gate PG5 and a signal ODTOFFD after the pass gate PG5 to activate a shifted on/off control signal ODTS.

Then, NAND operations are performed on the shifted on/off control signal ODTS and the termination resistance information signals ODT0, ODT1 and ODT2 received from the EMRS to activate signals ODTOUT0, ODTOUT1 and ODTOUT2, respectively. Accordingly, the signals ODTOUT0, ODTOUT1 and ODTOUT2 have information about resistances according to the termination resistance information signals ODT0, ODT1 and ODT2, respectively, as well as information about enable/disable timing of an ODT operation according to the delayed on/off control signal ODTS.

In a power-down mode (i.e., when the clock enable signal CKE has a logic low level), logic levels of the shift clocks RCLKDLL0, FCLKDLL1, RCLKDLL2 and FCLKDLL3 are all fixed to a logic high level to reduce current consumption. Accordingly, the pass gates PG2, PG3, PG4 and PG5 are all turned on, and thus the delayed on/off control signal ODT_SH passes through the shift register 130 without being shifted in response to the shift clocks RCLKDLL0, FCLKDLL1, RCLKDLL2 and FCLKDLL3.

FIG. 4 is a timing diagram illustrating operations of the typical ODT control circuit (shown in FIGS. 1 and 3) in the non-power-down mode and the power-down mode.

To begin with, the non-power-down mode when the clock enable signal CKE has a logic high level will be described. For convenience of explanation, the case where only the signal ODT0 among the termination resistance information signals ODT0, ODT1 and ODT2 is activated, i.e., the case where the termination resistance is set to 150Ω by EMRS will be described.

If the termination resistance information signal ODT0 is activated, the signal ODTENB is activated to a logic low level by the circuit 160. Then, the ODT buffer 110 and the shift register 130 are enabled. The on/off control signal ODT_SH is input from the external controller and then pass through the ODT buffer 110 and the setup/hold delay 120 to be output to the shift register 130 as a delayed on/off control signal ODT_SH. In the shift register 130, the delayed on/off control signal ODT_SH passes through the pass gate PG1 in response to the internal clock CLK0, and then sequentially transferred to the node NC and to the node ND. Thereafter, the delayed on/off control signal ODT_SH sequentially transferred further to the node NF, to the node NH and then to the node NI, in response to the RCLKDLL0, FCLKDLL1 and RCLKDLL2, respectively. The signal ODTOND before the pass gate PG5 which is turned on/off in response to the shift signal FCLKDLL3 and the signal ODTOFFD after the pass gate PG5 pass through respective delays. A NAND operation is performed on the signals ODTOND and ODTOFD to activate a shifted on/off control signal ODTS.

Then, a NAND operation is performed on the shifted on/off control signal ODTS and the termination resistance information signal ODT0 activated by the EMRS to activate the signal ODTOUT0. Accordingly, the signal ODTOUT0 has information about resistance according to the termination resistance information signals ODT0, ODT1 and ODT2 as well as information about enable/disable timing of the ODT operation according to the shifted on/off control signal ODTS.

In the power-down mode when the clock enable signal CKE has a logic low level, the shift clocks RCLKDLL0, FCLKDLL1, RCLKDLL2 and FCLKDLL3 are all fixed to a logic high level to reduce current consumption. Accordingly, the delayed on/off control signal ODT_SH passes through the shift register 130 without being delayed in synchronization with the shift clocks RCLKDLL0, FCLKDLL1, RCLKDLL2 and FCLKDLL3. Therefore, the signal ODTOUT0 is activated and deactivated without being delayed sufficiently.

As described above, since delay of the delayed on/off control signal in response to the shift clocks RCLKDLL0, FCLKDLL1, RCLKDLL2 and FCLKDLL3 does not take place in the power-down mode, enable/disable timing of the ODT operation in the power-down mode is advanced more than in the non-power-down mode. Therefore, during the operation of a memory device in one slot (for example, in a PC, a DRAM installed in one memory slot among a plurality of memory slots), ODT operation of a memory device in a power-down mode in another slot may be performed amiss, causing a failure.

SUMMARY OF THE INVENTION

Embodiments of the present invention are directed to providing an on-die-termination (ODT) control circuit and an ODT control method for preventing failure caused by premature enable/disable timing of an ODT operation in a power-down mode.

In accordance with an aspect of the present invention, there is provided an ODT control circuit, including a power-down delay configured to delay an on/off control signal in a power-down mode. In accordance with another aspect of the present invention, there is provided a mode detecting unit for detecting a power-down mode and a power-down delay configured to delay an on/off control signal in the power-down mode. In accordance with another aspect of the present invention, there is provided a shift register configured to delay an on/off control signal in synchronization with shift clocks in a non-power-down mode, and transfer the on/off control signal as received without delay in a power-down mode, a power-down delay configured to delay the on/off control signal in the power-down mode, and not to delay the on/off control signal in the non-power-down mode and a controller configured to control enabling/disabling of an on-die-termination operation according to information about enable/disable timing of an on-die-termination operation provided by the on/off control signal that have passed through the shift register and the power-down delay. In accordance with another aspect of the present invention, there is provided a delaying an on/off control signal in synchronization with shift clocks in a non-power-down mode, a delaying the on/off control signal in a power-down mode and a controlling enabling/disabling of an on-die-termination operation according to information about enable/disable timing of the on-die-termination operation provided by the delayed on/off control signal.

The on/off control signal is delayed in synchronization with shift clocks by a shift register in a non-power-down mode. However, the on/off control signal is not delayed in synchronization with the shift clocks in a power-down mode, which may advance enable/disable timing of the ODT operation. Therefore, the ODT control circuit in accordance with the aspect of the present invention includes the power-down delay for delaying the on/off control signal in the power-down mode, to prevent problems caused by the premature enabling/disabling timing of the ODT operation.

In accordance with another aspect of the present invention, there is provided an ODT control circuit, including: a shift register configured to delay an on/off control signal in synchronization with shift clocks in a non-power-down mode, and transfer the on/off control signal as received without delay in a power-down mode; a power-down delay configured to delay the on/off control signal in the power-down mode, and not to delay the on/off control signal in the non-power-down mode; and a controller configured to control enabling/disabling of an ODT operation according to information about enable/disable timing of an ODT operation provided by the on/off control signal that have passed through the shift register and the power-down delay.

The on/off control signal may be input from an external controller to the shift register.

In accordance with further another aspect of the present invention, there is provided an ODT control method, including: delaying an on/off control signal in synchronization with shift clocks in a non-power-down mode; delaying the on/off control signal in a power-down mode; and controlling enabling/disabling of an ODT operation according to information about enable/disable timing of the ODT operation provided by the delayed on/off control signal.

In other words, the ODT control method is identical to the typical method in the non-power-down mode. However, the ODT control method further includes delaying the on/off control signal in the power-down mode, to solve problems caused by the premature enabling/disabling timing of the ODT operation in the power-down mode.

DESCRIPTION OF SPECIFIC EMBODIMENTS

Hereinafter, an on-die-termination (ODT) control circuit and an ODT control method in accordance with the present invention will be described in detail with reference to the accompanying drawings.

Figure 5:
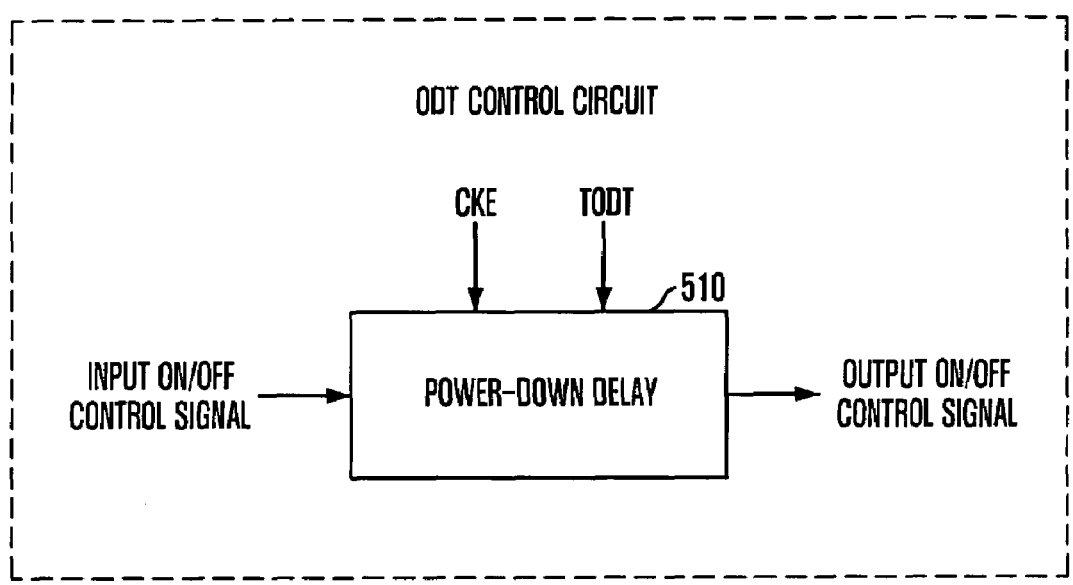
FIG. 5 is a block diagram of a power-down delay of an ODT control circuit in accordance with an embodiment of the present invention.

FIG. 5 is a block diagram of a power-down delay of an ODT control circuit in accordance with an embodiment of the present invention.

The ODT control circuit in accordance with the embodiment includes a power-down delay 510 for delaying an on/off control signal in a power-down mode, which is different from the typical ODT control circuit.

In the typical ODT control circuit, the on/off control signal is delayed in synchronization with shift clocks by a shift register in a non-power-down mode. However, it is not delayed in synchronization with the shift clocks in a power-down mode, because the shift clocks are not toggled in the power-down mode. Therefore, delay time of the on/off control signal in the power-down mode is different from that in the non-power-down mode. To solve this problem, the ODT control circuit in accordance with the embodiment is provided with the power-down delay 510 configured to delay the on/off control signal only in the power-down mode. As such, the ODT control circuit can reduce the difference between the delay time of the on/off control signal in the non-power-down mode and the delay time of the on/off control signal in the power-down mode.

The power-down delay 510 may be disposed anywhere along a path through which the on/off control signal passes in the ODT control circuit. For example, referring to FIG. 1, the on/off control signal ODT is input to the ODT buffer 110, passes through the setup/hold delay 120, and then input to the shift register 130 as a delayed on/off control signal ODT_SH. Thereafter, the on/off control signal ODT is transferred from the shift register 130 to the controller 140 as combined on/off control signals ODTOUT0, ODTOUT1 and ODTOUT2 having information about ODT resistance. The power-down delay 510 serves to delay the on/off control signal ODT, the delayed on/off control signal ODT_SH or the combined on/off control signals ODTOUT0, ODTOUT1 and OSTOUT2 only in the power-down mode. Therefore, no matter where the power-down delay 510 is disposed, the effect of the power-down delay is the same. For reference, the number of signals to be delayed may be different depending on the position of the power-down delay 510.

The power-down delay 510 receives the clock enable signal CKE to distinguish between the power-down mode and the non-power-down mode. In other words, the clock enable signal CKE is activated in the non-power-down mode and deactivated in the power-down mode.

Also, the test mode signal TODT is input to the power-down delay 510 to enable delay operation of the power-down delay 510. In other words, if the test mode signal TODT is activated, the power-down delay 510 delays the on/off control signal ODT, the delayed on/off control signal ODT_SH, or the combined on/off control signals ODTOUT0, ODTOUT1 and ODTOUT2 in the power-down mode. On the contrary, if the test mode signal TODT is deactivated, the power-down delay 510 does not delay the on/off control signal ODT, the delayed on/off control signal ODT_SH, nor the combined on/off control signals ODTOUT0, ODTOUT1 and ODTOUT2 even in the power-down mode. As is well known, the test mode signal TODT may be designed to be controlled by various methods such as a fuse-cutting and an MRS setting.

Figure 6:
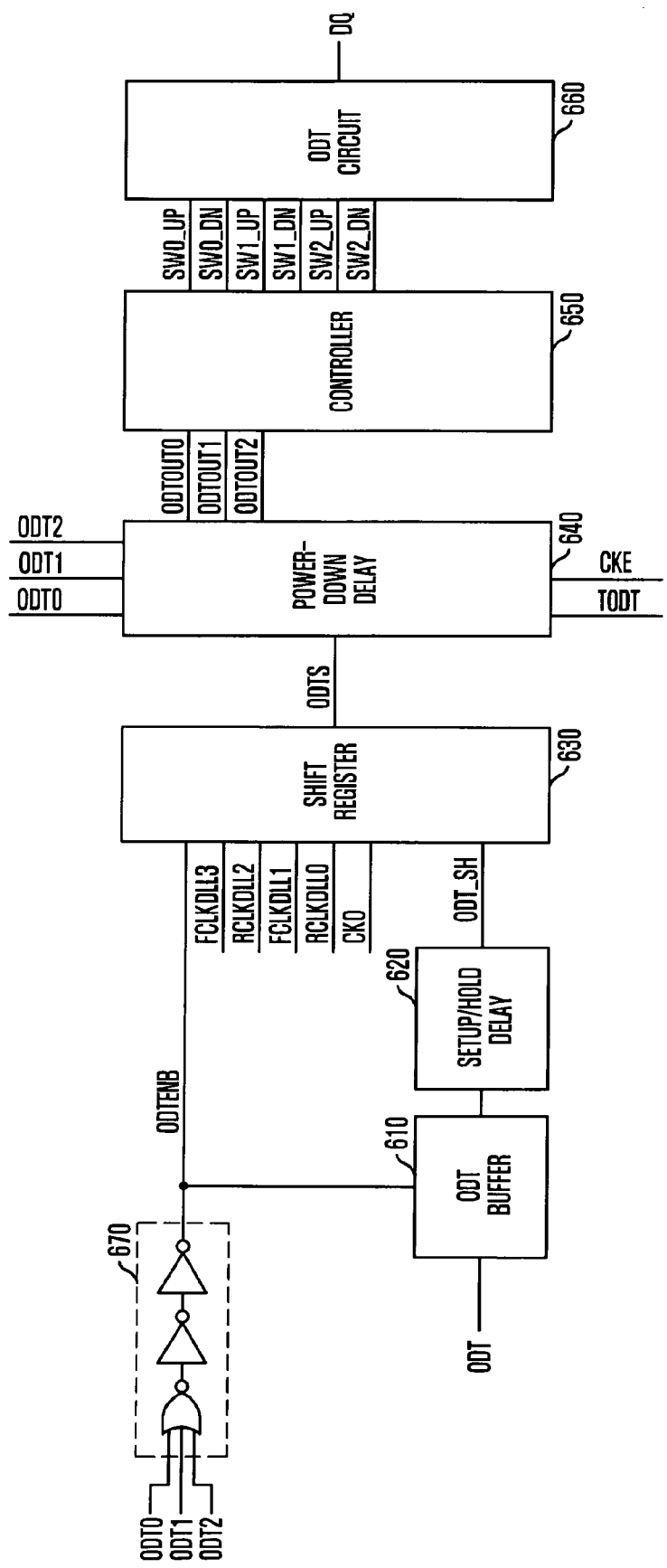
FIG. 6 is a block diagram of an ODT circuit and an ODT control circuit with a power-down delay in accordance with an embodiment of the present invention.

FIG. 6 is a block diagram of an ODT circuit and an ODT control circuit with a power-down delay in accordance with an embodiment of the present invention.

The ODT control circuit includes a shift register 630, a power-down delay 640, and a controller 650. The shift register 630 delays the delayed on/off control signal ODT_SH in synchronization with shift clocks RCLKDLL0, FCLKDLL1, RCLKDLL2 and FCLKDLL3 in a non-power-down mode, and transfers the delayed on/off control signal ODT_SH as received without delay in a power-down mode. The power-down delay 640 delays a shifted on/off control signal ODTS received from the shift register 630 in the power-down mode, whereas it does not delay the shifted on/off control signal ODTS in the non-power-down mode. The controller 650 controls enabling/disabling of the ODT operation according to information about enable/disable timing of the ODT operation provided by the combined on/off control signals ODTOUT0, ODTOUT1 and ODTOUT2 which also have ODT resistance information and are received from the power-down delay 640.

The ODT control circuit further includes an ODT buffer 610 for receiving the on/off control signal ODT from an external controller (for example, a memory controller, and a chipset), a setup/hold delay for setup/hold timing, and an enable circuit 670 for generating an enable signal ODTENB.

The shift register 630 delays the delayed on/off control signal ODT_SH in synchronization with the shift clocks RCLKDLL0, FCLKDLL1, RCLKDLL2 and FCLKDLL3 in the non-power-down mode. However, in the power-down mode, since the shift clocks RCLKDLL0, FCLKDLL1, RCLKDLL2 and FCLKDLL3 are not toggled so as to reduce current consumption, the shift register does not delay the delayed on/off control signal ODT_SH in synchronization with the shift clocks RCLKDLL0, FCLKDLL1, RCLKDLL2 and FCLKDLL3.

Figure 1:
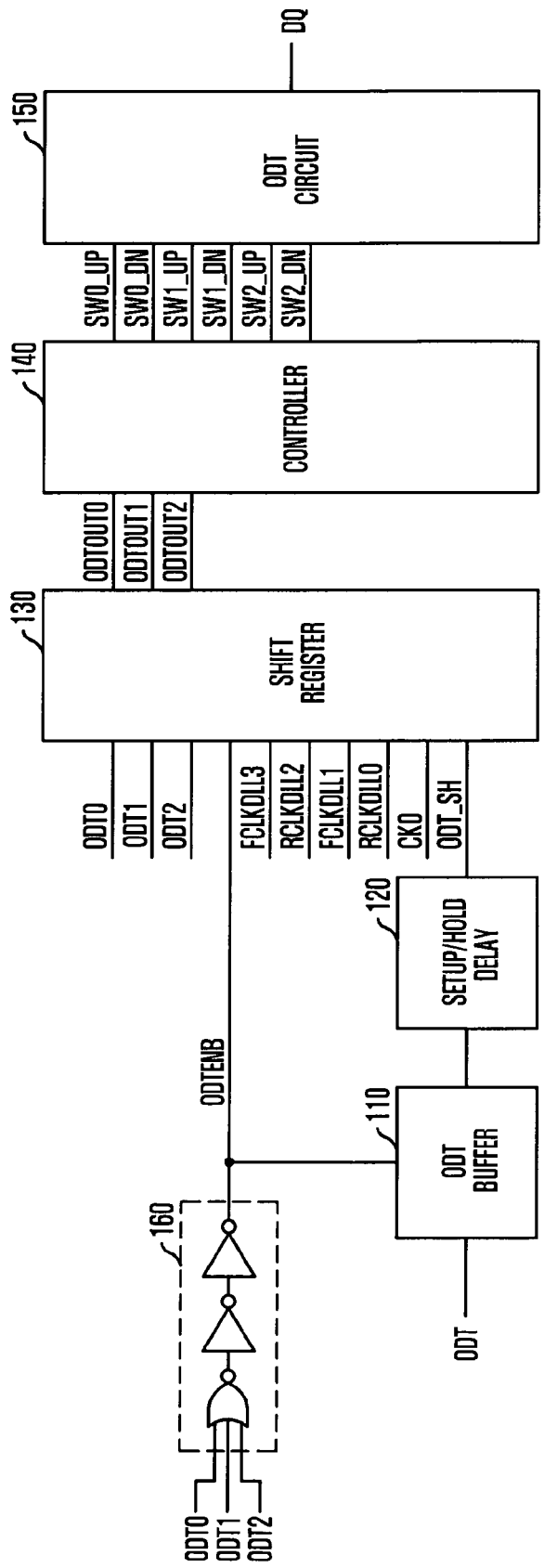
FIG. 1 is a block diagram of a typical on-die-termination (ODT) circuit and a typical ODT control circuit.
Figure 2:
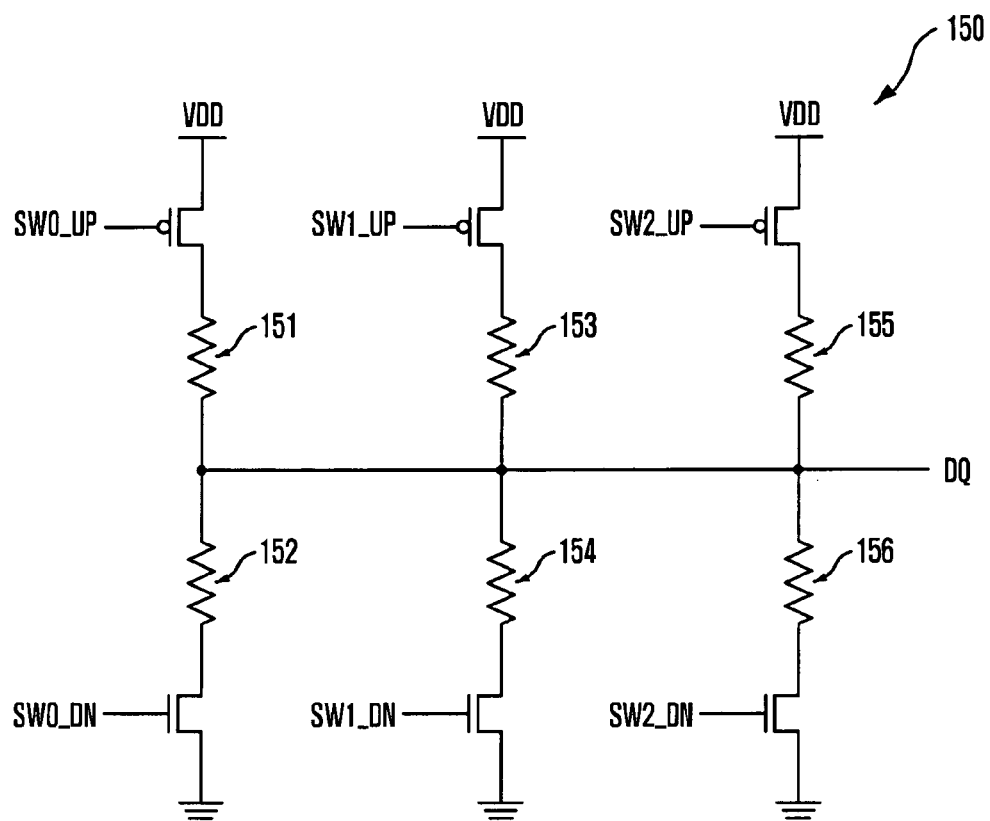
FIG. 2 is a circuit diagram of the ODT circuit of FIG. 1.

Referring to FIG. 6, the shift register 630 outputs the shifted on/off control signal ODTS, contrary to the typical shift register 130 shown in FIG. 1 that outputs the combined on/off control signals ODTOUT0, ODTOUT1 and ODTOUT2. This is because the termination resistance information signals ODT0, ODT1 and ODT2 are combined to the shifted on/off control signal ODTS by the power-down delay 640 in the embodiment, whereas they are combined to the delayed on/off control signal ODT_SH in the shift register 130 in the typical ODT control circuit. However, the present invention is not limited thereto. Instead, the termination resistance information signals ODT0, ODT1 and ODT2 may also be combined to the delayed on/off control signal ODT_SH in the shift resistor 130, like the typical ODT control circuit. Since the termination resistance information signals ODT0, ODT1 and ODT2 have already been described with reference to FIGS. 1 to 4, detailed descriptions thereof will be omitted herein.

The power-down delay 640 delays the shifted on/off control signal ODTS in the power-down mode (i.e., when the clock enable signal CKE has a logic low level), however, it does not delay the shifted on/off control signal ODTS in the non-power-down mode. Accordingly, it is possible to make up for a lack of delay of the shifted on/off control signal ODTS in the power-down mode. In addition, as described above, the power-down delay 640 combines the termination resistance information signals ODT0, ODT1 and ODT2 into the shifted on/off control signal ODTS to generate combined on/off control signals ODTOUT0, ODTOUT1 and ODTOUT2. The delay operation of the power-down delay 640 is enabled in response to the test mode signal TODT.

The controller 650 controls enabling/disabling of the ODT operation (i.e., enabling/disabling of the ODT circuit 660) according to enable/disable timing of the combined on/off control signals ODTOUT0, ODTOUT1 and ODTOUT2 that have passed through the shift register 630 and the power-down delay 640. In addition, the controller 650 controls resistance of the ODT circuit according to the termination resistance information signals ODT0, ODT1 and ODT2 combined to the combined on/off control signals ODTOUT0, ODTOUT1 and ODTOUT2. Since the controller 650 has the same configuration as the typical controller 140 in FIG. 1, detailed description thereof will be omitted herein.

Although the power-down delay 640 is disposed behind the shift register 630 in FIG. 6, the power-down delay 640 may also be disposed anywhere along a path for transferring the on/off control signal ODT, the delayed on/off control signal ODT_SH, the shifted on/off control signal ODTS, and the combined on/off control signals ODTOUT0, ODTOUT1 and ODTOUT2. For example, the power-down delay 640 may be disposed before the shift register 630 to control timing of the delayed on/off control signal ODT_SH input to the shift register 630. The power-down delay 640 may also be disposed behind the controller 650 to control timing of the ODT control signals SW0_UP, SW1_UP, SW2_UP, SW0_DN, SW1_DN and SW2_DN.

Figure 7:
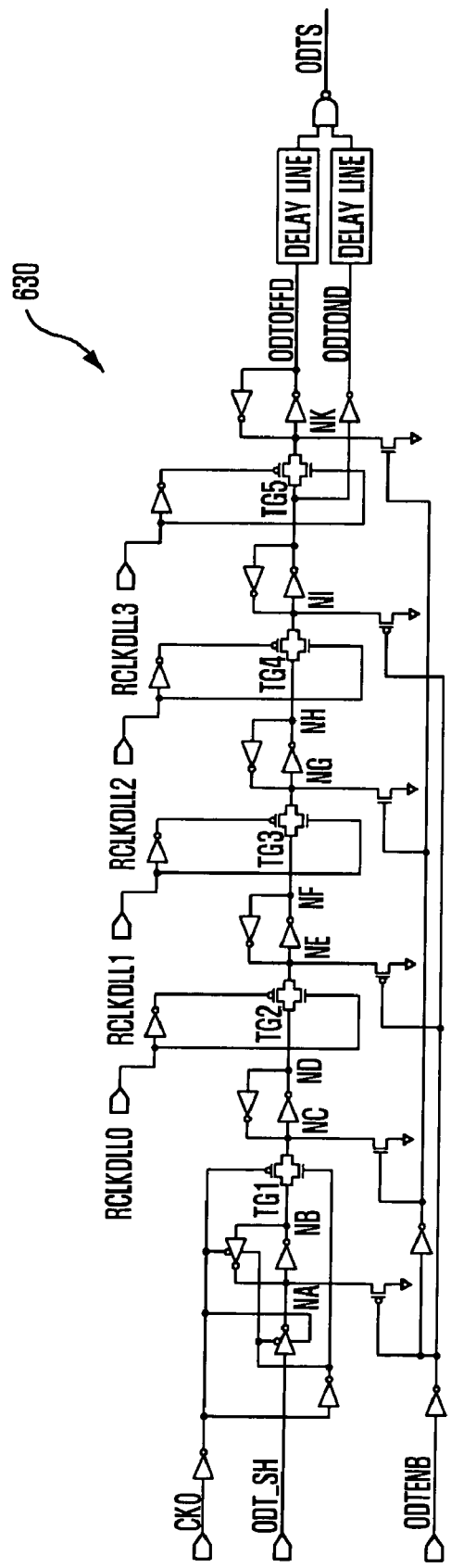
FIG. 7 is a circuit diagram of a shift register shown in FIG. 6.

FIG. 7 is a circuit diagram of the shift register 630 shown in FIG. 6.

Figure 3:
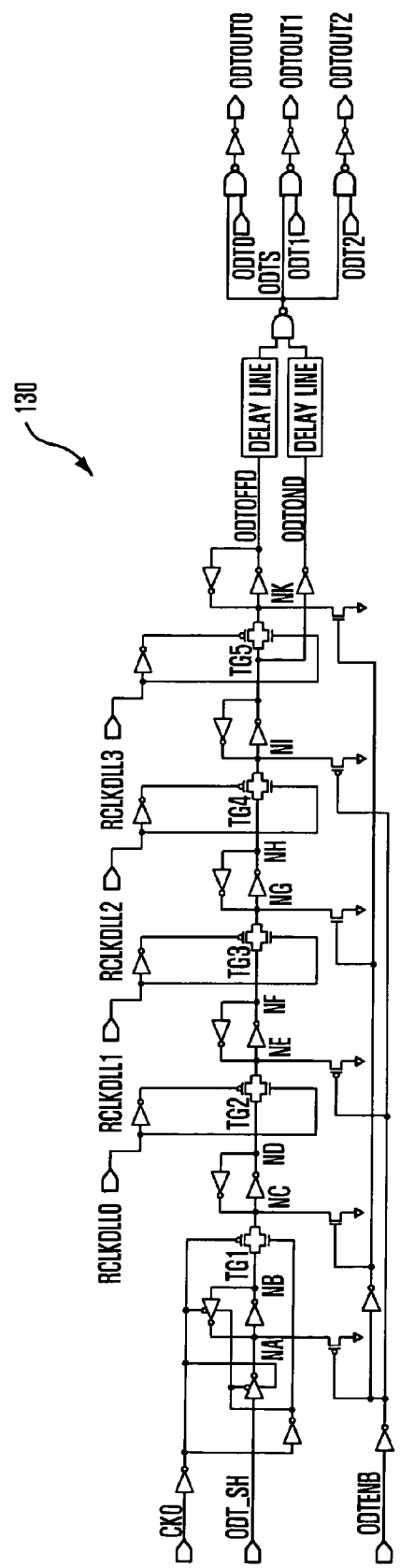
FIG. 3 is a circuit diagram of a shift register shown in FIG. 1.

Referring to FIG. 7, the shift register 630 is different from the typical shift register 130 shown in FIGS. 1 and 3 in that the combination circuit for receiving the shifted on/off control signal ODTS to generate the combined on/off control signals ODTOUT0, ODTOUT1 and ODTOUT2 (shown at right side of FIG. 3) is not provided thereto. This is because the shift register 630 does not serve to combine the termination resistance information signals ODT0, ODT1 and ODT2 into the delayed on/off control signal ODT_SH or the shifted on/off control signal ODTS, in this embodiment.

Operation and configuration of the shift register 630 are identical to those of the typical shift register 130 of FIG. 3, except that the circuit for receiving the shifted on/off control signal ODTS to generate the combined on/off control signals ODTOUT0, ODTOUT1 and ODTOUT2 (shown at right side of FIG. 3) is not provided thereto. Therefore, detailed description thereof will be omitted herein.

Figure 8:
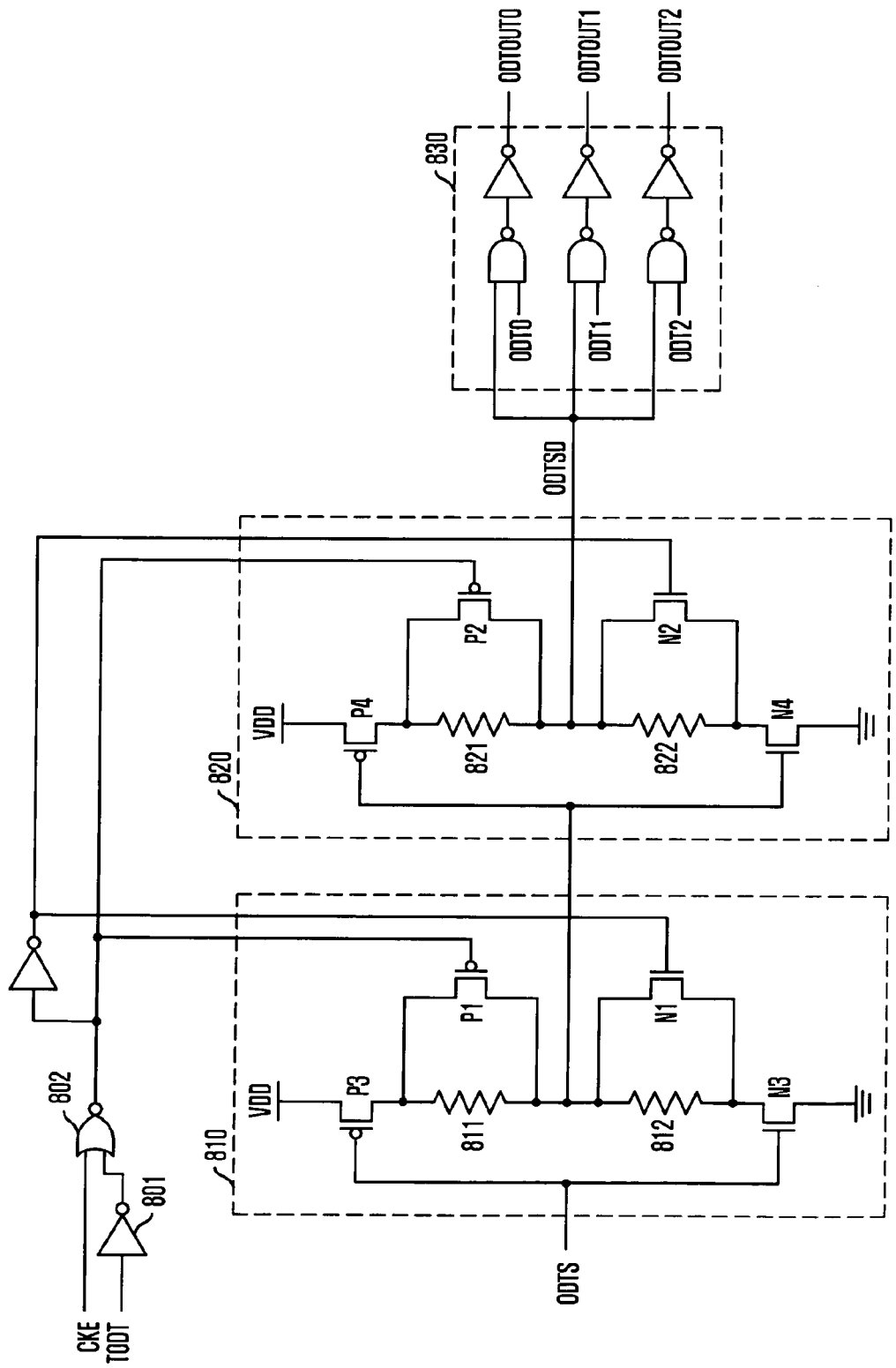
FIG. 8 is a circuit diagram of a power-down delay shown in FIG. 6.

FIG. 8 is a circuit diagram of the power-down delay 640 shown in FIG. 6.

Referring to FIG. 8, the power-down delay 640 includes one or more inverters 810 and 820 through which the shifted on/off control signal ODTS passes. Delay time of the inverters 810 and 820 is determined by a logic level of the clock enable signal CKE.

Specifically, each of the inverters 810 and 820 includes pull-up transistors P3 and P4, pull-down transistors N3 and N4, resistors 811 and 812 connected between the pull-up transistor P3 and the pull-down transistor N3, and resistors 821 and 822 connected between the pull-up transistor P4 and the pull-down transistor N4. Logic level of the clock enable signal CKE determines resistors to be bypassed, and thus determines the delay time of each of the inverters 810 and 820.

A combination circuit 830 is disposed behind the inverters 810 and 820 to combine termination resistance information signals ODT0, ODT1 and ODT2 having information about ODT resistance into an internal shifted on/off control signal ODTSD, which is different from the typical combination circuit provided to the shift register 130 in FIG. 3. Here, the internal shifted on/off control signal ODTSD is the shifted on/off control signal that have delayed or not delayed by the inverters 810 and 820. As such, the combination circuit 830 performs AND operation on the internal shifted on/off control signal ODTSD received from the inverter 820 and the termination resistance information signals ODT0, ODT1 and ODT2 activated by the EMRS to activate the combined on/off control signals ODTOUT0, ODTOUT1 and ODTOUT2.

The test mode signal TODT is an enable signal for enabling the power-down delay 640.

First, the case where the test mode signal TODT is activated will be described below. When the test mode signal TODT has a logic high level and the clock enable signal CKE has a logic low level in the power-down mode, the NOR gate 802 outputs signal TODTCKE having a logic high level, to turn off the transistors P1, P2, N1 and N2. Then, the resistors 811, 812, 821 and 822 in the inverters 810 and 820 are turned on so that current passes through the resistors 811, 812, 821 and 822 in the inverters 810 and 810. As such, the inverters 810 and 820 delay the shifted on/off control signal ODTS to generate the internal shifted on/off control signal ODTSD. Thereafter, the combination circuit performs AND operations on the internal shifted on/off control signal ODTSD and the termination resistance information signals ODT0, ODT1 and ODT2 to generate the combined on/off control signals ODTOUT0, ODTOUT1 and ODTOUT2.

When the test mode signal TODT has a logic high level and the clock enable signal CKE has a logic high level in the non-power-down mode, the NOR gate 802 outputs signal TODTCKE having a logic low level, to turn on the transistors P1, P2, N1 and N2. Then, the resistors 811, 812, 821 and 822 in the inverters 810 and 820 are turned off so that current cannot pass through the resistors 811, 812, 821 and 822 (i.e., current bypasses the resistors 811, 812, 821 and 822) in the inverters 810 and 810. As such, the inverters 810 and 820 do not delay the shifted on/off control signal ODTS except the inevitable delay caused by the transistors and the like inside the inverters. Thereafter, the combination circuit performs AND operation on the internal shifted on/off control signal ODTSD received from the inverter 820 and the termination resistance information signals ODT0, ODT1 and ODT2 to generate the combined on/off control signals ODTOUT0, ODTOUT1 and ODTOUT2.

Second, the case where the test mode signal TODT is deactivated will be described below. When the test mode signal TODT is deactivated, the NOR gate 802 outputs signal TODTCKE having a logic low level independent of the logic level of the clock enable signal CKE (independent of the power-down mode and the non-power-down mode). Accordingly, the shifted on/off control signal ODTS is never delayed. Consequently, the ODT control circuit operates in the same manner as the typical ODT control circuit without the power-down delay 640.

The combination circuit 830 is provided to the power-down delay 640 in order to combine the termination resistance information signals ODT0, ODT1 and ODT2 into the shifted on/off control signal ODTS. Accordingly, in the case where the power-down delay 640 is disposed in another positions of the ODT control circuit or the combination operation is performed by another elements, the combination circuit 830 may not be provided to the power-down delay 640.

The power-down delay 640 serves to delay the shifted on/off control signal ODTS depending on the operation mode. It will be apparent to those skilled in the art that the power-down delay 640 may also be implemented with various configurations other than that shown in FIG. 8.

Figure 9:
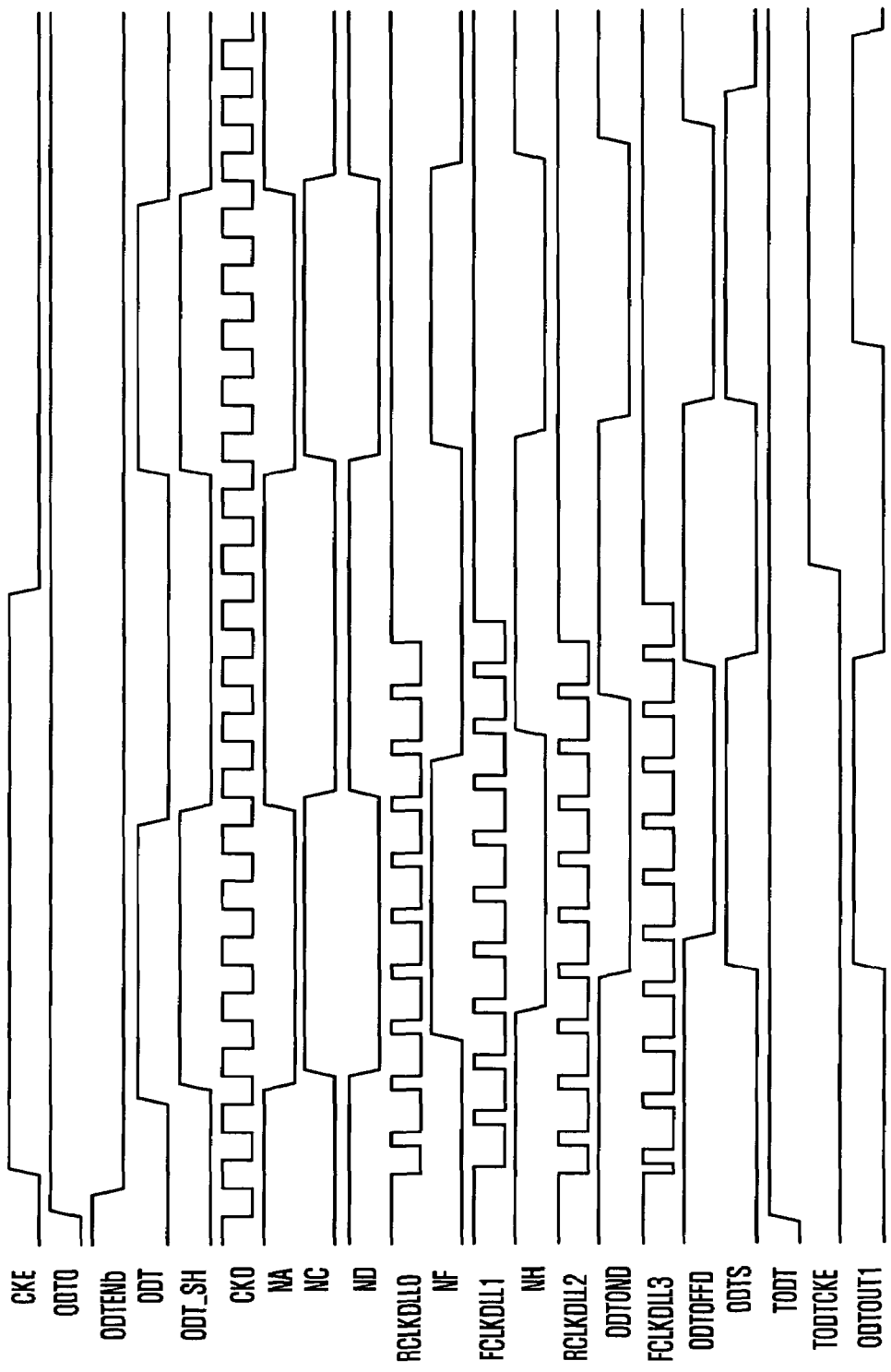
FIG. 9 is a timing diagram illustrating an operation of an ODT control circuit in accordance with an embodiment of the present invention.

FIG. 9 is a timing diagram illustrating an operation of the ODT control circuit in accordance with an embodiment of the present invention.

For convenience of explanation, the case where only the termination resistance information signal ODT0 is activated among the termination resistance information signals ODT0, ODT1 and ODT2, i.e., the case where the termination resistance is set to 150Ω by the EMRS will be described below.

Figure 4:
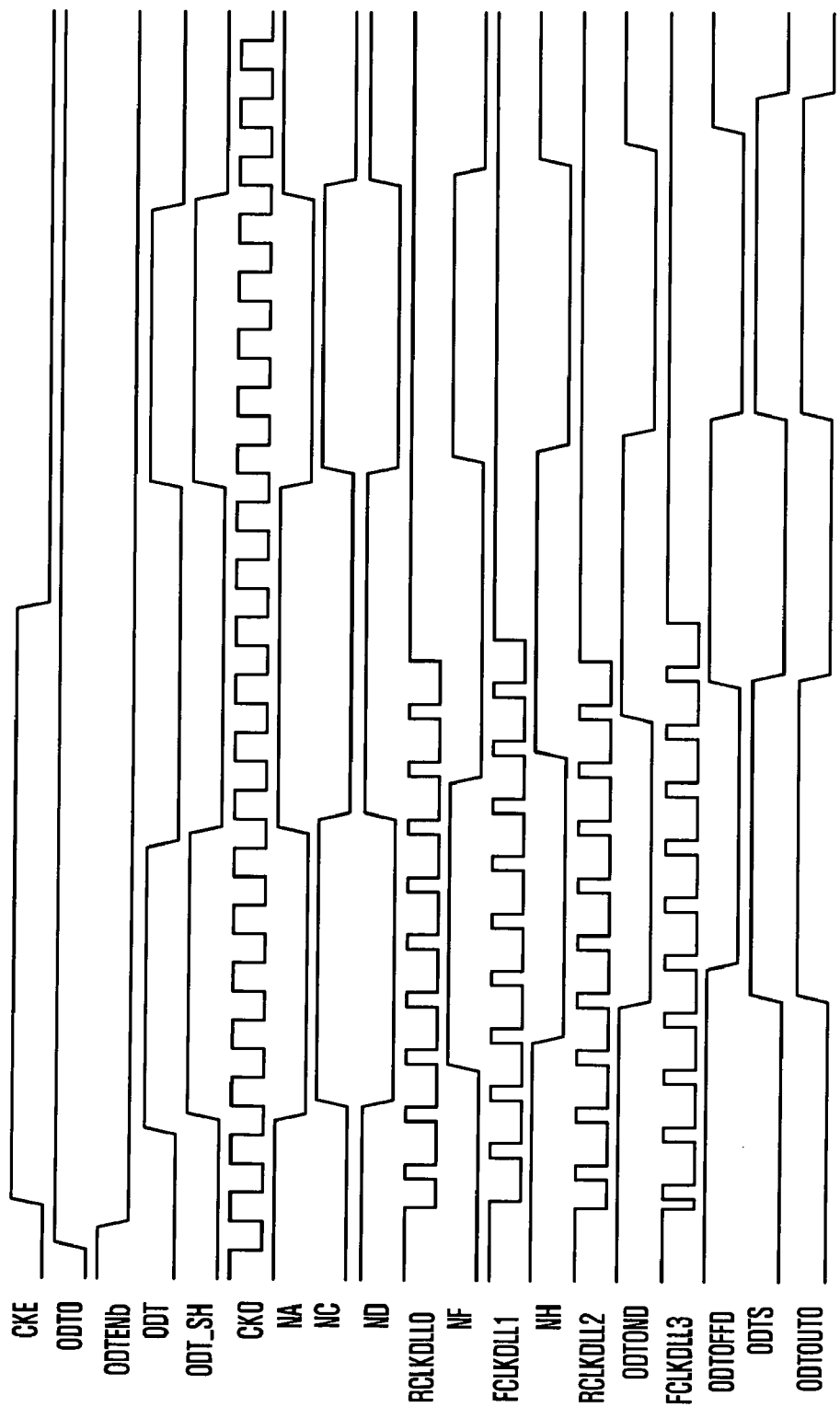
FIG. 4 is a timing diagram illustrating operations of the typical ODT control circuit shown in FIGS. 1 and 3, in a non-power-down mode and a power-down mode.

Referring to FIG. 9, in a non-power-down mode when the clock enable signal CKE is activated, operation of the ODT control circuit is basically identical to that shown in FIG. 4. However, in a power-down mode when the clock enable signal CKE is deactivated, the shifted on/off control signal ODTS is delayed by the power-down delay 640 so that the combined on/off control signals ODTOUT0, ODTOUT1 and ODTOUT2 are activated a predetermined delay time after the activation of the shifted on/off control signal ODTS.

Accordingly, even if the shift clocks RCLKDLL0, FCLKDLL1, RCLKDLL2 and FCLKDLL3 are fixed to a logic high level in the power-down mode so that the shift register 630 cannot delay the delayed on/off control signal ODT_SH, the power-down delay 640 can delay the shifted on/off control signal ODTS instead. Therefore, problems caused by premature enable/disable timing of the ODT operation in the power-down mode can be prevented.

Hereinafter, an ODT control method in accordance with an embodiment of the present invention will be described with reference to FIGS. 5 and 6.

The ODT control method includes: delaying an on/off control signal in synchronization with shift clocks RCLKDLL0, FCLKDLL1, RCLKDLL2 and FCLKDLL3 in a non-power-down mode; delaying the on/off control signal in a power-down mode; and controlling enabling/disabling of an ODT operation according to information about enable/disable timing of the ODT operation provided by the delayed on/off control signal. Here, the on/off control signal has information about enable/disable timing of an ODT operation. The on/off control signal may be an on/off control signal ODT, a delayed on/off control signal ODT_SH, a shifted on/off control signal ODTS, or combined on/off control signals ODTOUT0, ODTOUT1 and ODTOUT2.

The non-power-down mode and the power-down mode may be distinguished by the activation/deactivation of a clock enable signal.

The delaying of the on/off control signal in the non-power-down mode may be performed either after or before the delaying of the on/off control signal in the power-down mode. In addition, combining of termination resistance information signals ODT0, ODT1 and ODT2 into the on/off control signal may be included in the delaying of the on/off control signal in the non-power-down mode or the delaying of the on/off control signal in the power-down mode.

In accordance with the present invention, the OCT control circuit includes the power-down delay for delaying the on/off control signal in the power-down mode. As such, even if the on/off control signal is not delayed in synchronization with shift clocks in the power-down mode, the on/off control signal can be delayed by the power-down delay. Therefore, it is possible to prevent failure caused by premature enable/disable timing of the ODT operation.

While the present invention has been described with respect to the specific embodiments, it will be apparent to those skilled in the art that various changes and modifications may be made without departing from the spirit and scope of the invention as defined in the following claims.

What is claimed is:

1. An on-die-termination control circuit, comprising:
   a mode detecting unit configured to detect a power-down mode and generate a power mode signal for distinguishing between a power-down mode and a non-power-down mode; and
   a power-down delay configured to receive the power mode signal to delay an on/off control signal in the power-down mode in response to an activation of the power mode signal and not to delay the on/off control signal in the non-power mode in response to a deactivation of the power mode signal.

2. The on-die-termination control circuit as recited in claim 1, wherein the on/off control signal is delayed in synchronization with shift clocks by a shift register in a non-power-down mode, and the on/off control signal is not delayed in synchronization with the shift clocks in the power-down mode.

3. The on-die-termination control circuit as recited in claim 2, wherein the on/off control signal is received from an external controller.

4. The on-die-termination control circuit as recited in claim 1, wherein the power-down delay is enabled in response to a test mode signal.

5. The on-die-termination control circuit as recited in claim 1, wherein the power-down delay comprises at least one inverter through which the on/off control signal passes, and delay time of the at least one inverter is determined by a logic level of a clock enable signal.

6. The on-die-termination control circuit as recited in claim 5, wherein the at least one inverter comprises a pull-up transistor; a pull-down transistor; and a transistor connected between the pull-up transistor and the pull-down transistor, and whether the resistor is bypassed or not is determined by the logic level of the clock enable signal.

7. The on-die-termination control circuit as recited in claim 5, wherein the power-down delay is enabled in response to a test mode signal, and the delay time of the at least one inverter is independent of the logic level of the clock enable signal when the test mode signal is deactivated.

8. The on-die-termination control circuit as recited in claim 7, wherein a logic level of the test mode signal is determined by fuse-cutting.

9. An on-die-termination control circuit, comprising:
a mode detecting unit a power-down mode;
a shift register configured to delay an on/off control signal in synchronization with shift clocks in a non-power-down mode, and transfer the on/off control signal as received without delay in a power-down mode;
a power-down delay configured to delay the on/off control signal in the power-down mode, and not to delay the on/off control signal in the non-power-down mode; and
a controller configured to control enabling/disabling of an on-die-termination operation according to information about enable/disable timing of an on-die-termination operation provided by the on/off control signal that have passed through the shift register and the power-down delay.

10. The on-die-termination control circuit as recited in claim 9, wherein the on/off control signal is input from an external controller to the shift register.

11. The on-die-termination control circuit as recited in claim 9, wherein the power-down delay combines resistance information determined by a mode register set into the on/off control signal.

12. The on-die-termination control circuit as recited in claim 11, wherein the controller controls the enabling/disabling of the on-die-termination operation according to activation/deactivation timing of the on/off control signal that was delayed by the shift register and the power-down delay, and controls on-die-termination resistance according to resistance information combined into the on/off control signal by the power-down delay.

13. The on-die-termination control circuit as recited in claim 9, wherein the power-down delay is enabled in response to a test mode signal.

14. The on-die-termination control circuit as recited in claim 9, wherein the power-down delay comprises at least one inverter through which the on/off control signal passes, and delay time of the at least one inverter is determined by a logic level of a clock enable signal.

15. The on-die-termination control circuit as recited in claim 14, wherein the at least one inverter comprises a pull-up transistor includes:
a pull-down transistor; and
a plurality of transistors connected between the pull-up transistor and the pull-down transistor, and whether the resistors are bypassed or not is determined by the logic level of the clock enable signal.

16. The on-die-termination control circuit as recited in claim 14, wherein the power-down delay is enabled in response to a test mode signal, and the delay time of the inverter is constant independent of the logic level of the clock enable signal when the test mode signal is deactivated.

17. The on-die-termination control circuit as recited in claim 16, wherein a logic level of the test mode signal is determined by fuse-cutting.

* * * * *